United States Patent
Oh et al.

(10) Patent No.: US 8,343,810 B2
(45) Date of Patent: Jan. 1, 2013

(54) SEMICONDUCTOR DEVICE AND METHOD OF FORMING FO-WLCSP HAVING CONDUCTIVE LAYERS AND CONDUCTIVE VIAS SEPARATED BY POLYMER LAYERS

(75) Inventors: JiHoon Oh, Kyoungki-do (KR); SinJae Lee, Kyoungki-do (KR); JinGwan Kim, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 93 days.

(21) Appl. No.: 12/857,362

(22) Filed: Aug. 16, 2010

(65) Prior Publication Data

US 2012/0038053 A1 Feb. 16, 2012

(51) Int. Cl.
*H01L 21/50* (2006.01)

(52) U.S. Cl. .............. 438/122; 257/E23.136

(58) Field of Classification Search .......... 257/773, 257/758, 777, E23.136; 438/122–124
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,765,299 B2 * | 7/2004 | Takahashi et al. | 257/777 |
| 7,045,899 B2 * | 5/2006 | Yamane et al. | 257/777 |
| 7,064,440 B2 * | 6/2006 | Jobetto et al. | 257/758 |
| 7,550,833 B2 * | 6/2009 | Mihara | 257/686 |
| 7,619,901 B2 | 11/2009 | Eichelberger et al. | |
| 7,759,246 B2 * | 7/2010 | Matsuki et al. | 438/629 |
| 7,932,517 B2 * | 4/2011 | Negishi | 257/48 |
| 7,999,384 B2 * | 8/2011 | Lin | 257/758 |
| 2004/0070064 A1 * | 4/2004 | Yamane et al. | 257/686 |
| 2005/0258547 A1 * | 11/2005 | Terui | 257/777 |
| 2006/0110853 A1 | 5/2006 | Chen et al. | |
| 2007/0069272 A1 * | 3/2007 | Wakabayashi et al. | 257/310 |
| 2008/0105967 A1 | 5/2008 | Yang et al. | |
| 2008/0166836 A1 * | 7/2008 | Jobetto | 438/109 |

* cited by examiner

*Primary Examiner* — Nathan Ha

(74) *Attorney, Agent, or Firm* — Robert D. Atkins; Patent Law Group: Atkins & Associates, P.C.

(57) ABSTRACT

A Fo-WLCSP has a first polymer layer formed around a semiconductor die. First conductive vias are formed through the first polymer layer around a perimeter of the semiconductor die. A first interconnect structure is formed over a first surface of the first polymer layer and electrically connected to the first conductive vias. The first interconnect structure has a second polymer layer and a plurality of second vias formed through the second polymer layer. A second interconnect structure is formed over a second surface of the first polymer layer and electrically connected to the first conductive vias. The second interconnect structure has a third polymer layer and a plurality of third vias formed through the third polymer layer. A semiconductor package can be mounted to the WLCSP in a PoP arrangement. The semiconductor package is electrically connected to the WLCSP through the first interconnect structure or second interconnect structure.

30 Claims, 22 Drawing Sheets

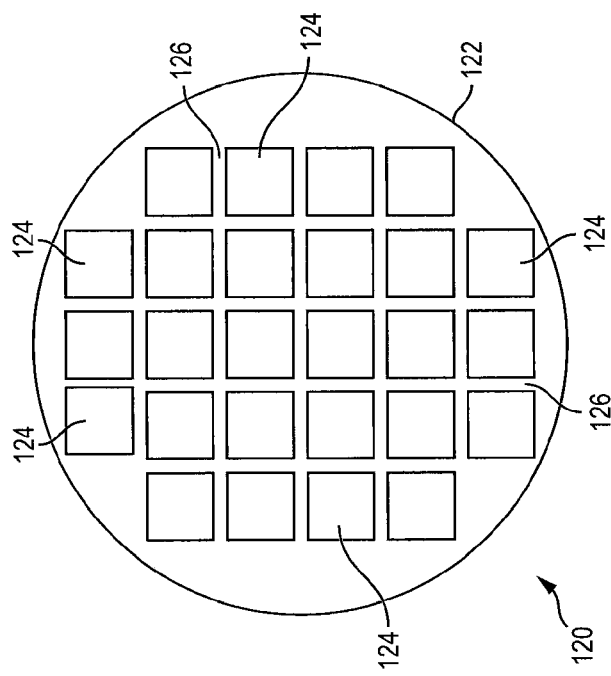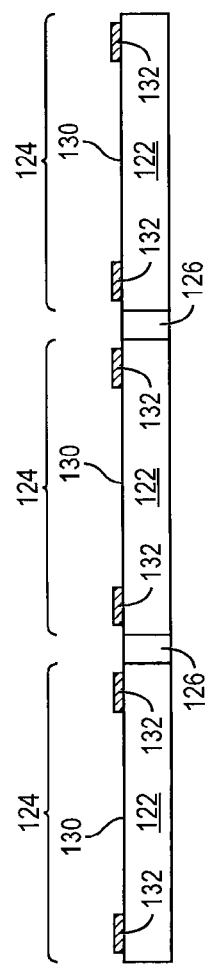
FIG. 4a
FIG. 4b

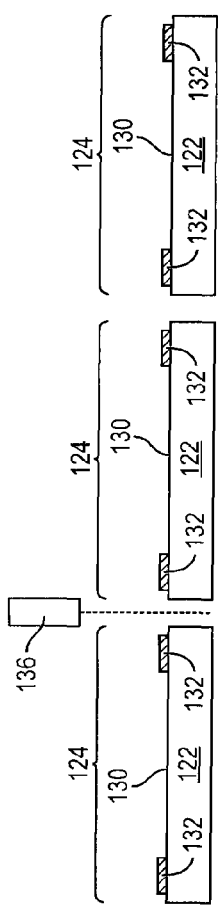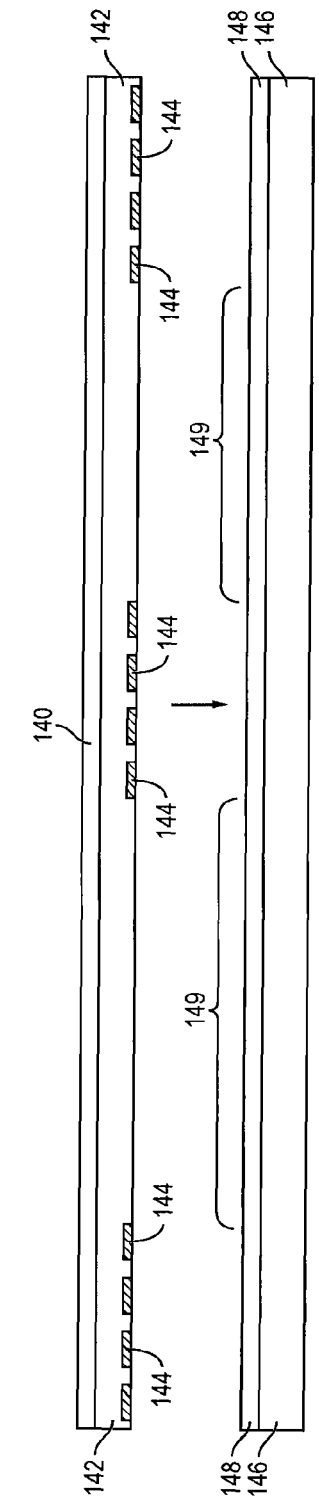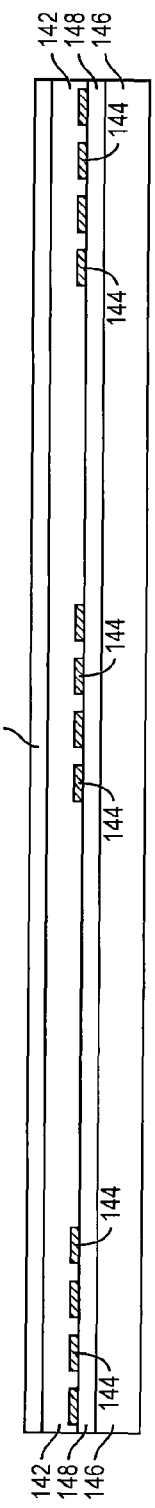

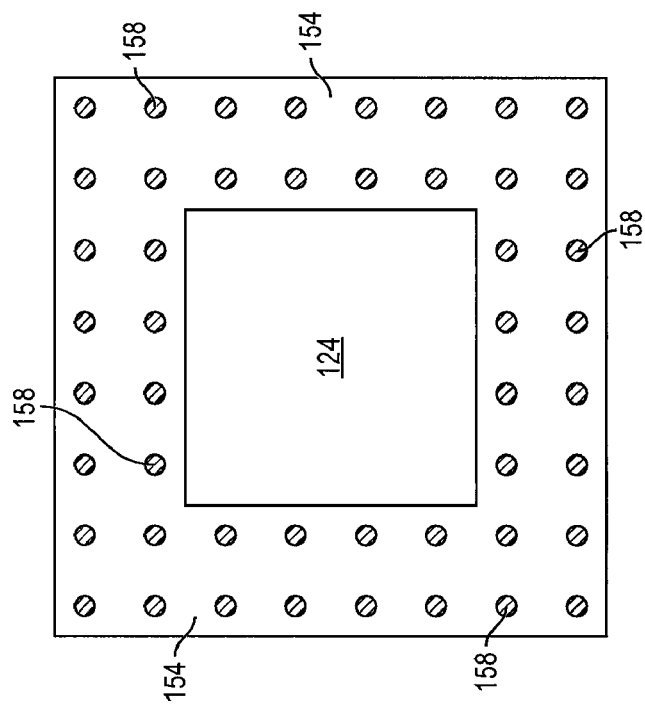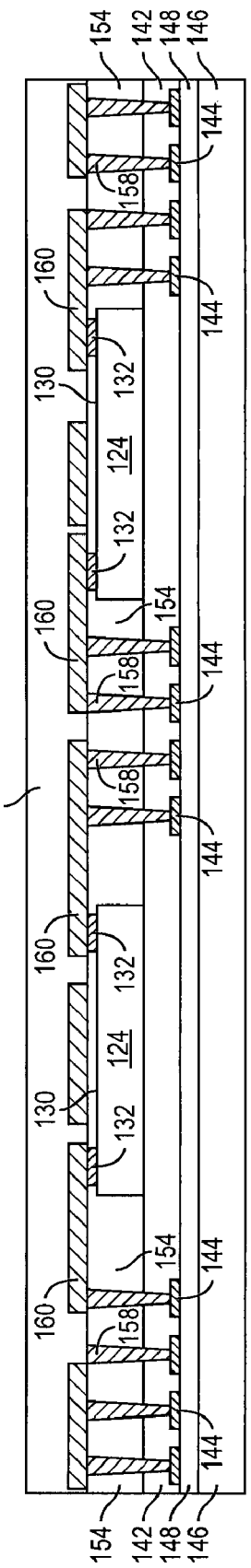

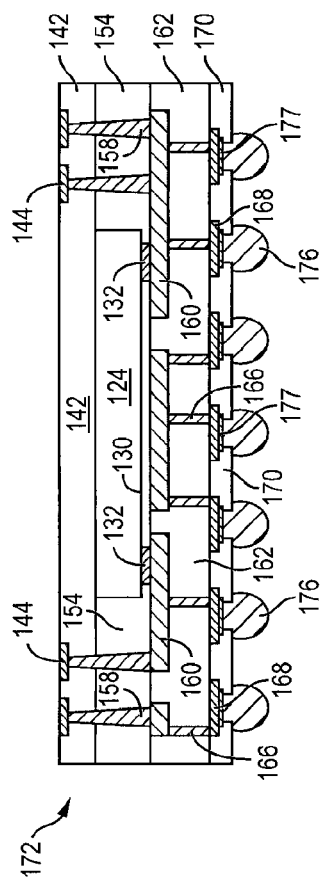
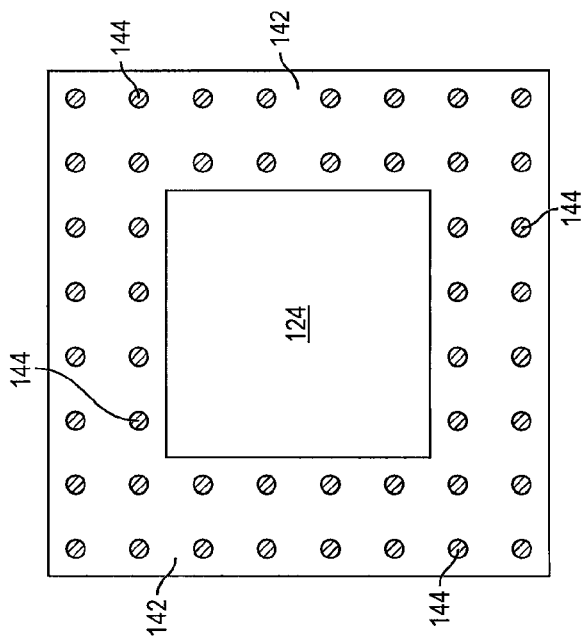
FIG. 6a
FIG. 6b

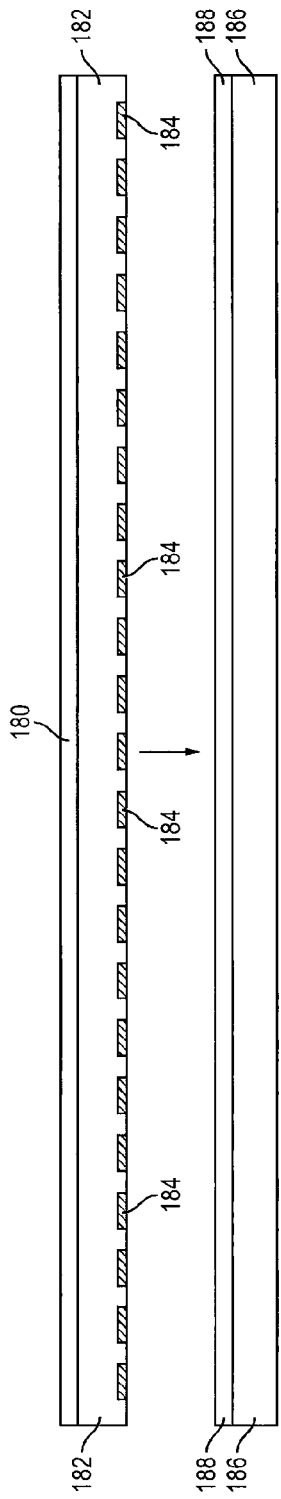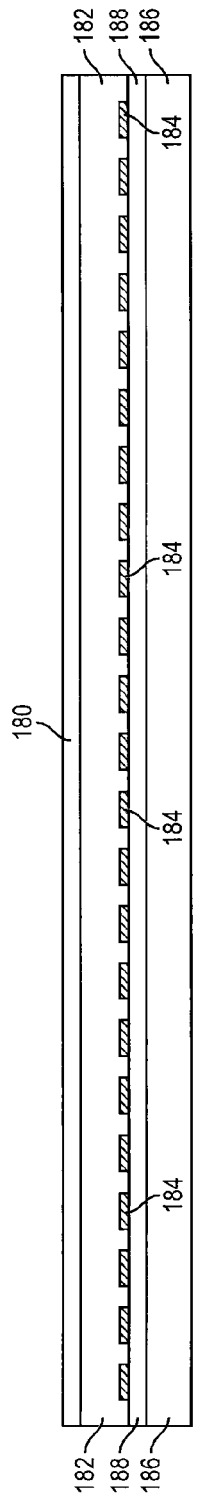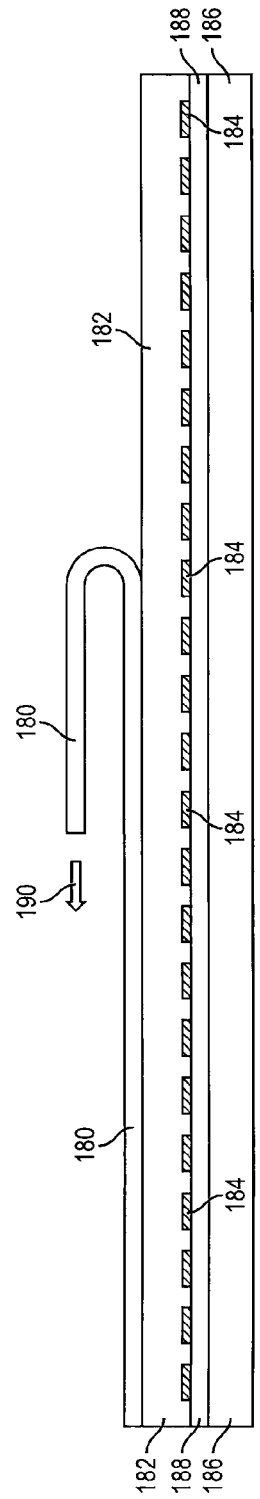
FIG. 8a
FIG. 8b
FIG. 8c

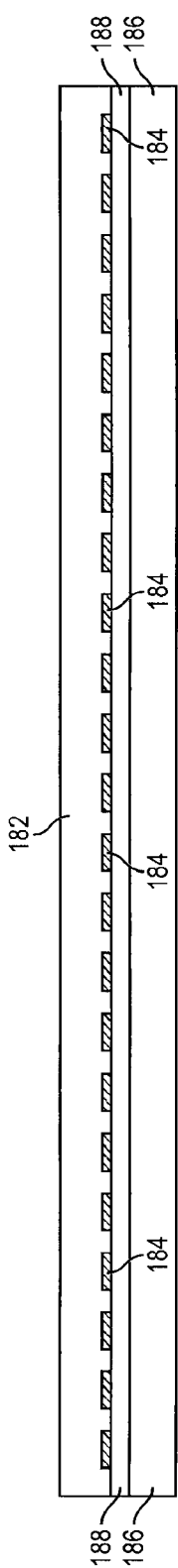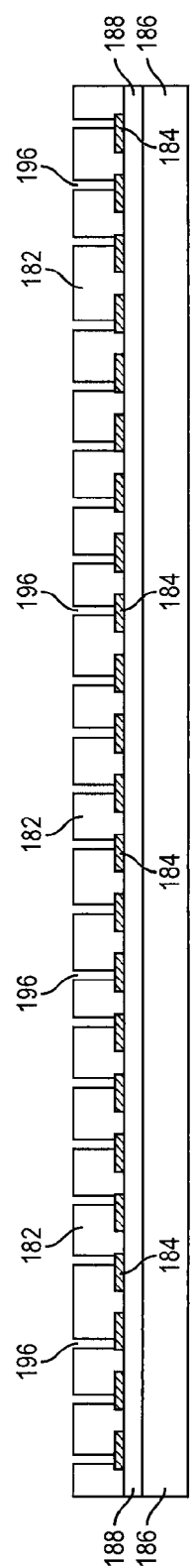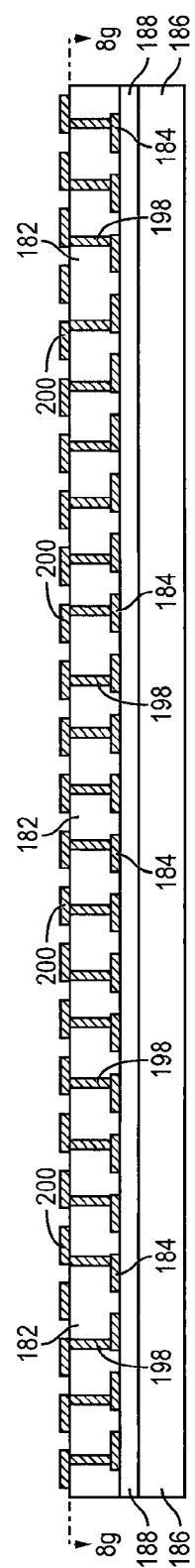

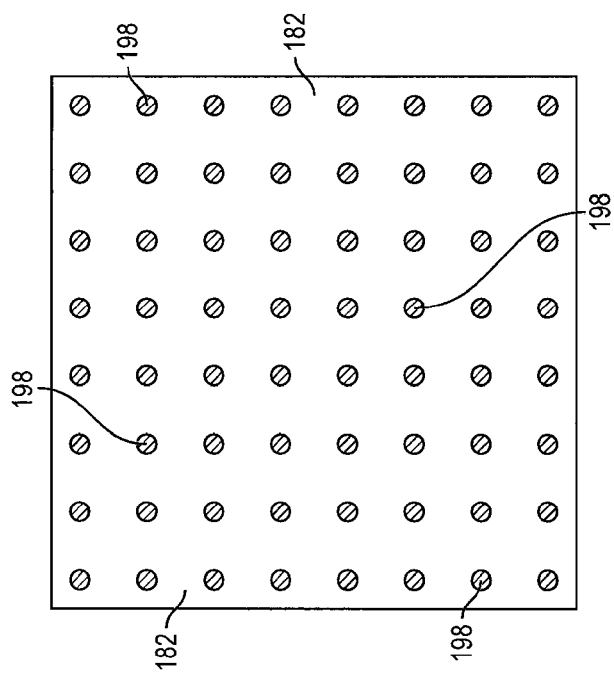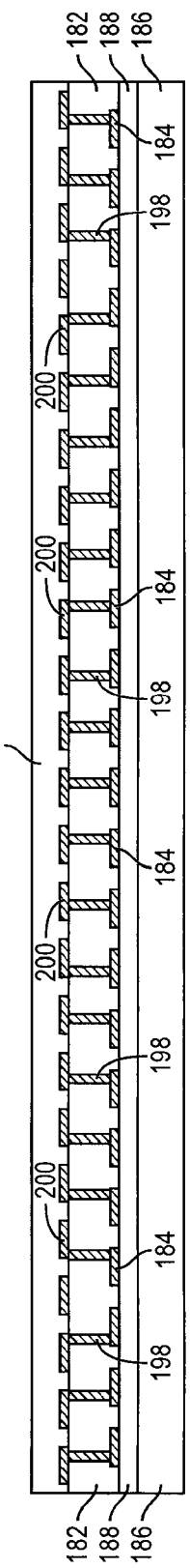

US 8,343,810 B2

SEMICONDUCTOR DEVICE AND METHOD OF FORMING FO-WLCSP HAVING CONDUCTIVE LAYERS AND CONDUCTIVE VIAS SEPARATED BY POLYMER LAYERS

FIELD OF THE INVENTION

The present invention relates in general to semiconductor devices and, more particularly, to a semiconductor device and method of forming fan-out wafer level chip scale package (Fo-WLCSP) having conductive layers and conductive vias separated by polymer layers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional package-on-package (PoP) Fo-WLCSP 10 with semiconductor die 12 stacked over semiconductor die 14 and enclosed by encapsulant 16. A build-up interconnect structure 18 is formed over the stacked semiconductor die 12-14 and encapsulant 16. Semiconductor die 12 and 14 are electrically connected to interconnect structure 18 with bond wires 20 and 22. Semiconductor die 24 is enclosed by encapsulant 26. A build-up interconnect structure 28 is formed over semiconductor die 24 and encapsulant 26. Semiconductor die 24 is electrically connected to interconnect structure 28 with bond wires 30. The build-up interconnect structure 18 is electrically connected to build-up interconnect structure 28 using bumps 32 formed around a perimeter of semiconductor die 24 and encapsulant 26.

The interconnect capability of Fo-WLCSP 10 is limited by the height requirement of encapsulant 26 formed around semiconductor die 24. That is, bumps 32 must be formed with sufficient size to span the gap between build-up interconnect structures 18 and 28. The gap is dictated by the height of encapsulant 26. Accordingly, the height of encapsulant 26 restricts the bump arrangement options, bump pitch, bump size, and input/output (I/O) count.

SUMMARY OF THE INVENTION

A need exists to provide a Fo-WLCSP without using encapsulant around the semiconductor die to reduce bump pitch and bump size, as well as increase bump arrangement options and I/O count. Accordingly, in one embodiment, the present invention is a method of making a WLCSP comprising the steps of providing a first polymer layer including a plurality of contact pads formed within the first polymer layer, attaching the first polymer layer to a carrier, mounting a semiconductor die to the first polymer layer, forming a second polymer layer over the semiconductor die and first polymer layer, forming a plurality of first conductive vias through the first and second polymer layers, and forming a first conductive layer over the second polymer layer. The first conductive layer is electrically connected to the first conductive vias and semiconductor die. The first conductive vias are electrically connected to the contact pads. The method further includes the steps of forming a third polymer layer over the second polymer layer and first conductive layer, forming a plurality of second conductive vias through the third polymer layer, forming a second conductive layer over the third polymer layer, and forming a first interconnect structure over the third polymer layer and second conductive layer. The second conductive vias are electrically connected to the first conductive layer. The second conductive layer is electrically connected to the second conductive vias.

In another embodiment, the present invention is a method of making a WLCSP comprising the steps of providing a first polymer layer including a plurality of contact pads formed within the first polymer layer, attaching the first polymer layer to a carrier, forming a plurality of first conductive vias through the first polymer layer, and forming a first conductive layer over the first polymer layer. The first conductive vias are electrically connected to the contact pads. The first conductive layer is electrically connected to the first conductive vias. The method further includes the steps of forming a second polymer layer over the first polymer layer, mounting a semiconductor die to the second polymer layer, forming a third polymer layer over the semiconductor die and second polymer layer, forming a plurality of second conductive vias through the second and third polymer layers, and forming a second conductive layer over the third polymer layer. The second conductive vias are electrically connected to the first conductive layer. The second conductive layer is electrically connected to the second conductive vias and semiconductor die. The method further includes the steps of forming a fourth polymer layer over the third polymer layer and second conductive layer, forming a plurality of third conductive vias through the fourth polymer layer, forming a third conductive layer over the fourth polymer layer, and forming a first interconnect structure over the fourth polymer layer and third conductive layer. The third conductive vias are electrically connected to the second conductive layer. The third conductive layer is electrically connected to the third conductive vias.

In another embodiment, the present invention is a method of making a WLCSP comprising the steps of providing a semiconductor die, forming a first polymer layer around the semiconductor die, forming a plurality of first conductive vias through the first polymer layer, forming a first interconnect structure over a first surface of the first polymer layer electrically connected to the first conductive vias, and forming a second interconnect structure over a second surface of the first polymer layer opposite the first surface. The second interconnect structure is electrically connected to the first conductive vias.

In another embodiment, the present invention is a WLCSP comprising a semiconductor die and first polymer layer formed around the semiconductor die and second polymer layer. A plurality of first conductive vias is formed through the first polymer layers. A first interconnect structure is formed over a first surface of the first polymer layer electrically connected to the first conductive vias. A second interconnect structure is formed over a second surface of the first polymer layer opposite the first surface. The second interconnect structure is electrically connected to the first conductive vias.

BRIEF DESCRIPTION OF THE DRAWINGS

FIGS. 4a-4c illustrate a semiconductor wafer containing a plurality of semiconductor die;

FIGS. 5a-5m illustrate a process of forming a Fo-WLCSP with conductive layers and conductive vias separated by polymer layers;

FIGS. 6a-6b illustrate the Fo-WLCSP with conductive layers and conductive vias separated by polymer layers;

DETAILED DESCRIPTION OF THE DRAWINGS

Figure 1:
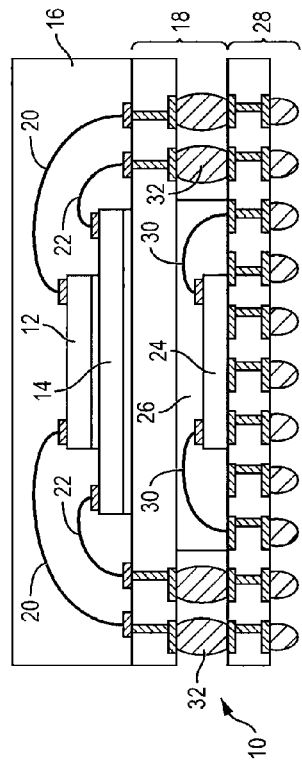
FIG. 1 illustrates a conventional PoP Fo-WLCSP with the semiconductor die enclosed by encapsulant.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
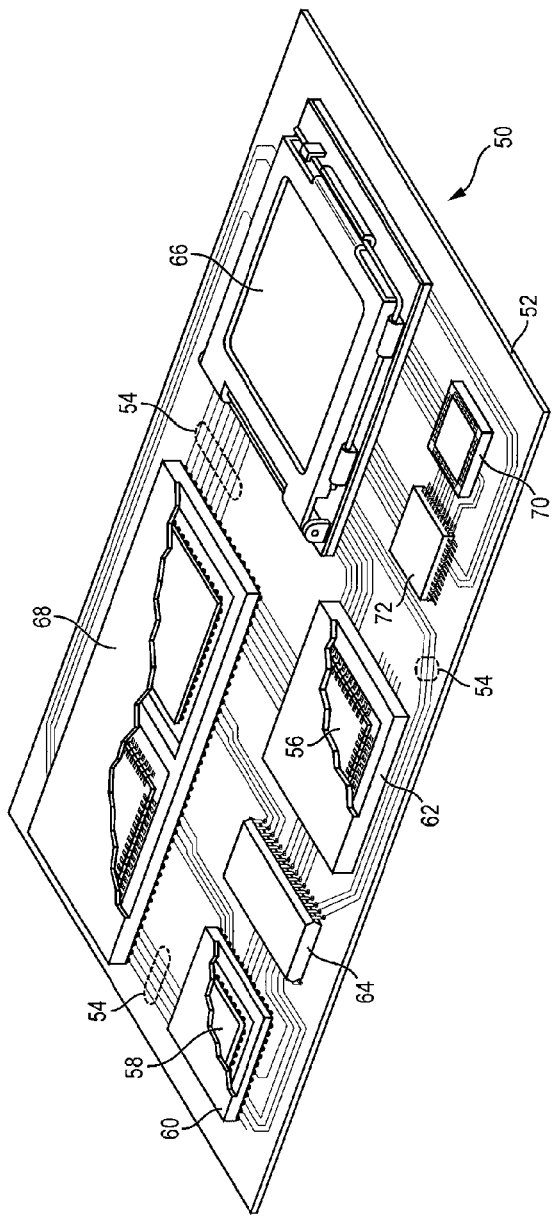
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
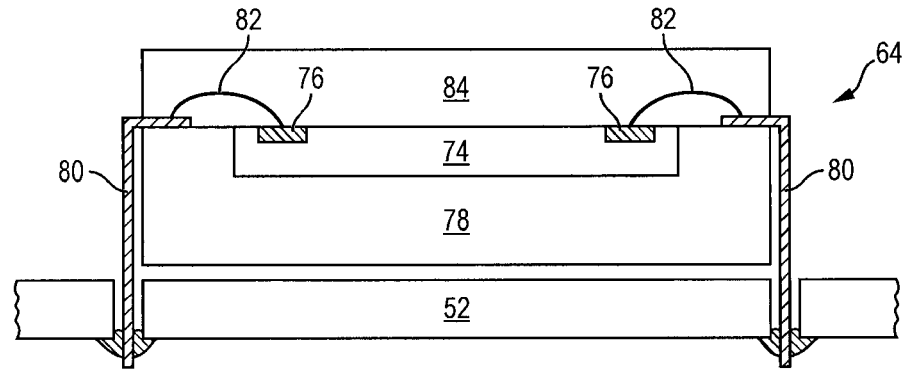
FIGS. 3a-3c illustrate further detail of the representative semiconductor packages mounted to the PCB.
Figure 3B:
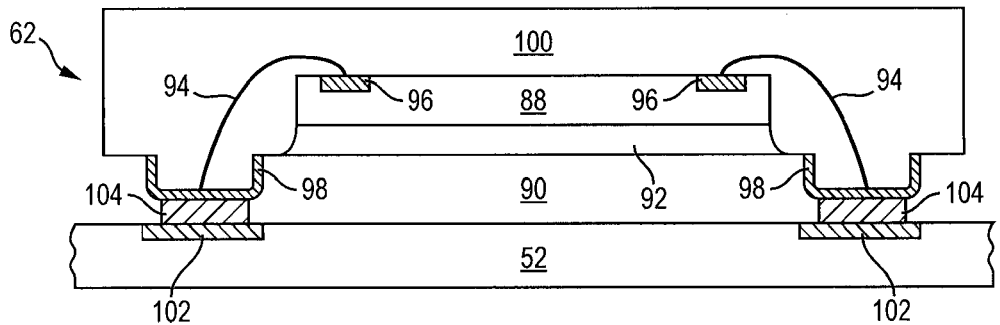
Figure 3C:
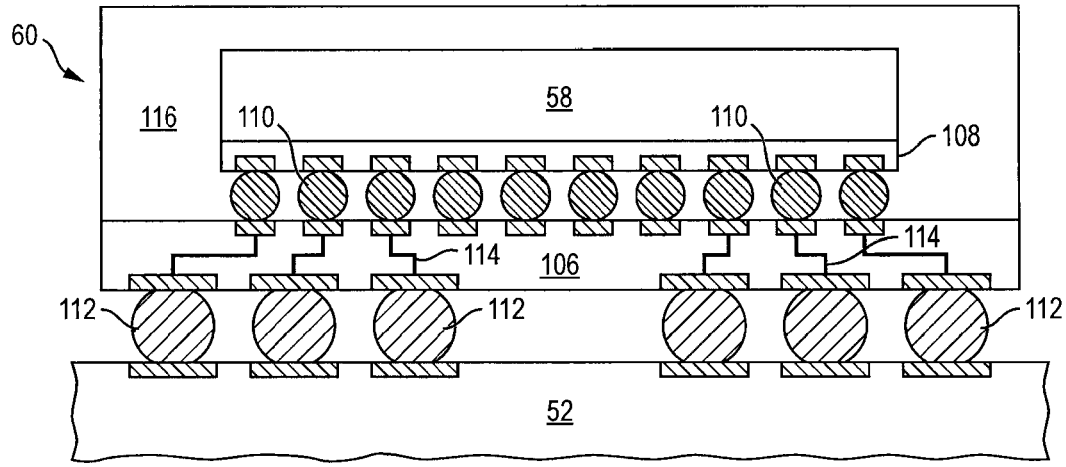

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 4b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

In FIG. 4c, semiconductor wafer 120 is singulated through saw street 126 using a saw blade or laser cutting tool 136 into individual semiconductor die 124.

Figure 5C:
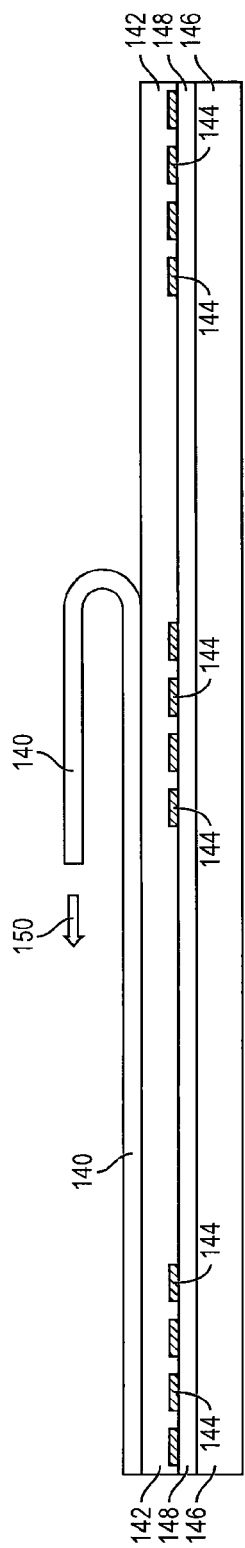

FIGS. 5a-5m illustrate, in relation to FIGS. 2 and 3a-3c, a process of forming a Fo-WLCSP with conductive layers and conductive vias separated by polymer layers. In FIG. 5a, a substrate or carrier 140 contains temporary or sacrificial base material such as silicon, polymer, beryllium oxide, or other suitable low-cost, rigid material for structural support. In one embodiment, carrier 140 is a tape.

A polymer layer 142 is formed over carrier 140. Polymer layer 142 can be an oxide, nitride, or glass material. An electrically conductive layer 144 is formed within polymer layer 142 using a patterning and metal deposition process such as PVD, CVD, sputtering, electrolytic plating, and electroless plating. Conductive layer 144 can be one or more layers of Al, Cu, Sn, Ni, Au, Ag, or other suitable electrically conductive material.

A temporary carrier or substrate 146 contains sacrificial base material such as silicon, polymer, polymer composite, metal, ceramic, glass, glass epoxy, beryllium oxide, or other suitable low-cost, rigid material for structural support. An interface layer or double-sided tape 148 is formed over carrier 146 as a temporary adhesive bonding film or etch-stop layer.

In FIG. 5b, leading with polymer layer 142 and contact pads 144, carrier 140 is mounted to interface layer 148 over carrier 146. In one embodiment, polymer layer 142 is laminated to interface layer 148. Conductive layer 144 operates as an array of contact pads formed around a perimeter of die attach area 149. Polymer layer 142 and contact pads 144 constitute an interconnect structure.

In FIG. 5c, carrier 140 is removed from polymer layer 142 by mechanical peeling in the direction of arrow 150. Polymer layer 142 and contact pads 144 remain affixed to interface layer 148 and carrier 146. Alternatively, carrier 140 can be removed by chemical etching, CMP, mechanical grinding, thermal bake, UV light, laser scanning, or wet stripping to expose polymer layer 142.

Figure 5D:
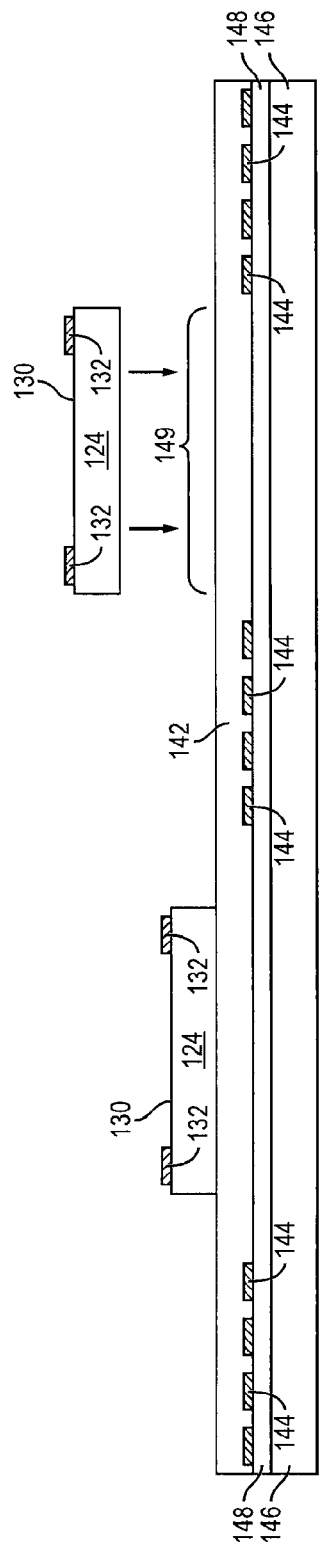

In FIG. 5d, semiconductor die 124 from FIG. 4a-4c are mounted to polymer layer 142 with active surface 130 oriented away from the polymer layer using a pick and place operation. Semiconductor die 124 is positioned over die attach area 149 within the array of contact pads 144.

Figure 5E:
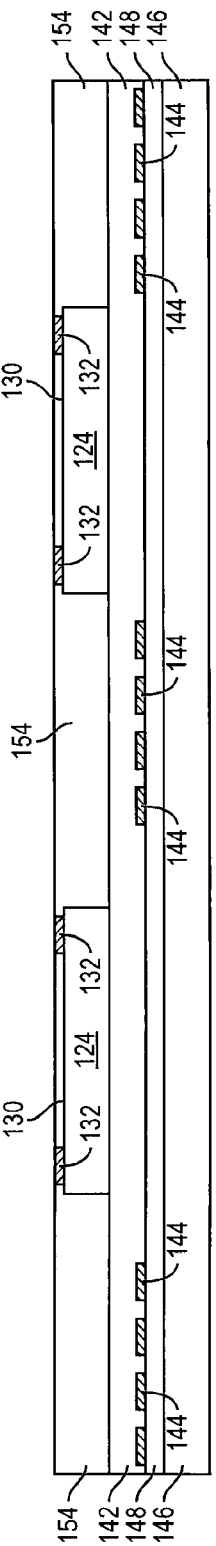

In FIG. 5e, a polymer layer 154 is formed over semiconductor die 124 and polymer layer 142. Polymer layer 154 can be an oxide, nitride, or glass material. A portion of polymer layer 154 can be removed by an etching process to expose contact pads 132 for subsequent electrical interconnect.

Figure 5F:
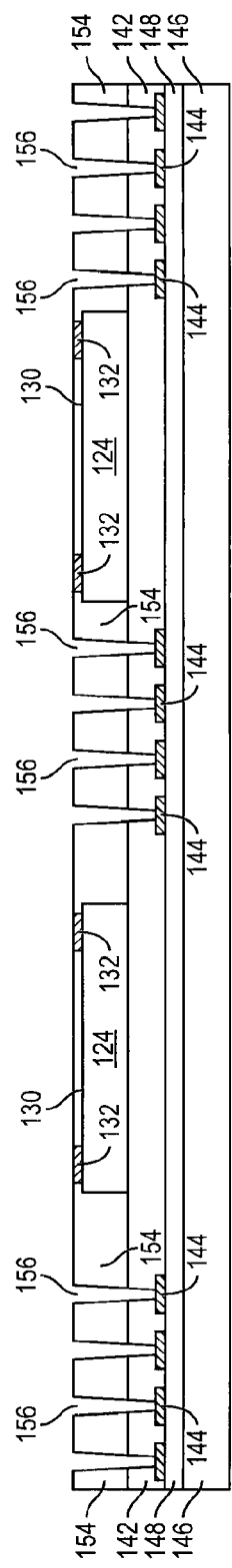
Figure 5G:
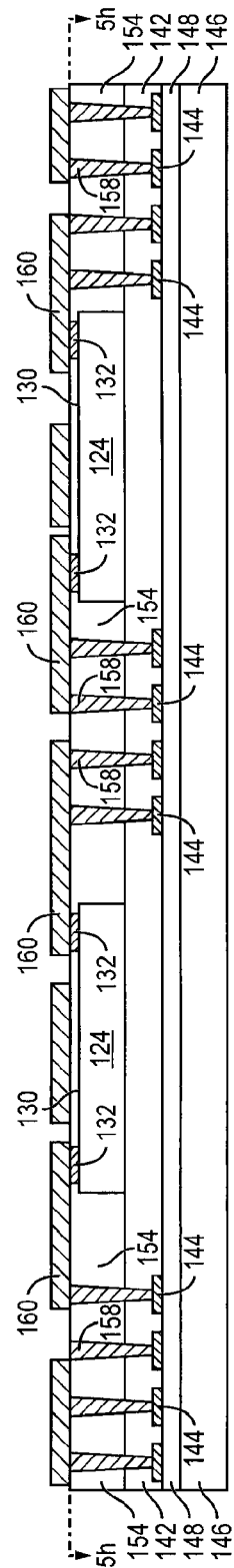

In FIG. 5f, a plurality of vias 156 is formed through polymer layer 154 and 142 extending down to contact pads 144 using mechanical drilling, laser drilling, or deep reactive ion etching (DRIE). In FIG. 5g, vias 156 are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive pillars or vias 158. Conductive vias 158 are electrically connected to contact pads 144.

FIG. 5h shows a top view of conductive vias 158 formed through polymer layer 154 around a perimeter of semiconductor die 124 taken along line 5h-5h in FIG. 5g.

An electrically conductive layer or redistribution layer (RDL) 160 is formed over polymer layer 154 and conductive vias 158 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. One portion of conductive layer 160 is electrically connected to contact pads 132 and conductive vias 158. Other portions of conductive layer 160 can be electrically common or electrically isolated depending on the design and function of semiconductor die 124.

Figure 5J:
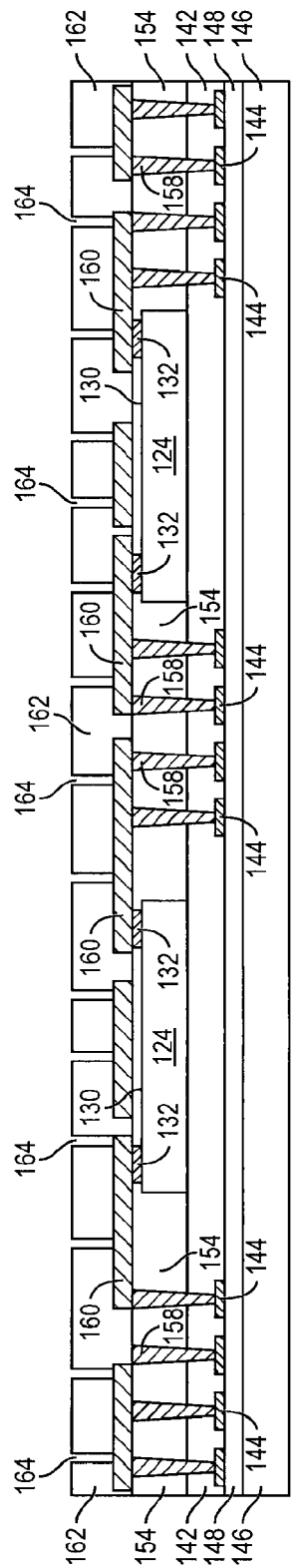
Figure 5K:
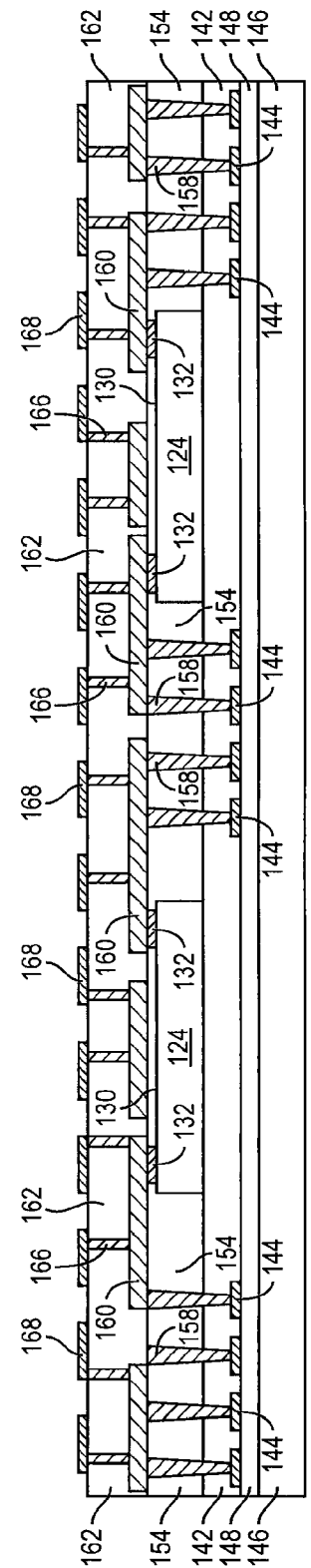

In FIG. 5i, a polymer layer 162 is formed over polymer layer 154 and conductive layer 160. Polymer layer 162 can be an oxide, nitride, or glass material. A plurality of vias 164 is formed through polymer layer 162 extending down to conductive layer 160 using mechanical drilling, laser drilling, or DRIE, as shown in FIG. 5j. In FIG. 5k, vias 164 are filled with Al, Cu, Sn, Ni, Au, Ag, Ti, W, poly-silicon, or other suitable electrically conductive material using electrolytic plating, electroless plating process, or other suitable metal deposition process to form z-direction conductive pillars or vias 166. Conductive vias 166 are electrically connected to conductive layer 160.

An electrically conductive layer or RDL 168 is formed over polymer layer 162 and conductive vias 166 using a patterning and metal deposition process such as printing, PVD, CVD, sputtering, electrolytic plating, and electroless plating. Conductive layer 168 can be one or more layers of Al, Cu, Sn, Ni, Au, Ag, or other suitable electrically conductive material. One portion of conductive layer 168 is electrically connected to conductive vias 166. Other portions of conductive layer 168 can be electrically common or electrically isolated depending on the design and function of semiconductor die 124.

Figure 5L:
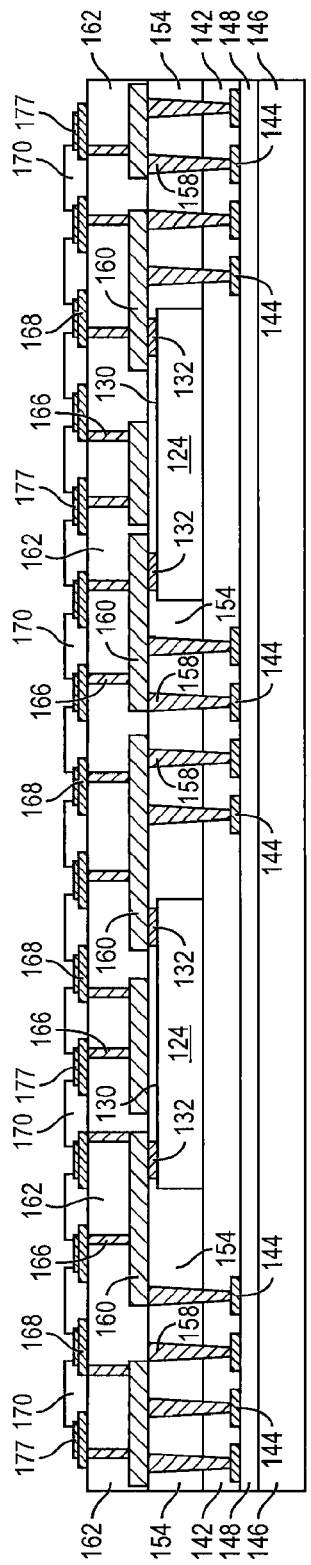

In FIG. 5l, an optional under bump metallization (UBM) 177 is formed over conductive layer 168. A solder resist layer 170 is formed over polymer layer 162, conductive layer 168, and UBM 177. A portion of solder resist layer 170 is removed by an etching process to expose conductive layer 168 or UBM 177 for bump formation or additional package interconnect. Alternatively, an insulating or passivation layer is formed over polymer layer 162, conductive layer 168, and UBM 177 using PVD, CVD, printing, spin coating, spray coating, sintering or thermal oxidation. The insulating layer contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Polymer layer 162, conductive vias 166, conductive layer 168, UBM 177, and photoresist layer 170 constitute an interconnect structure.

Figure 5M:
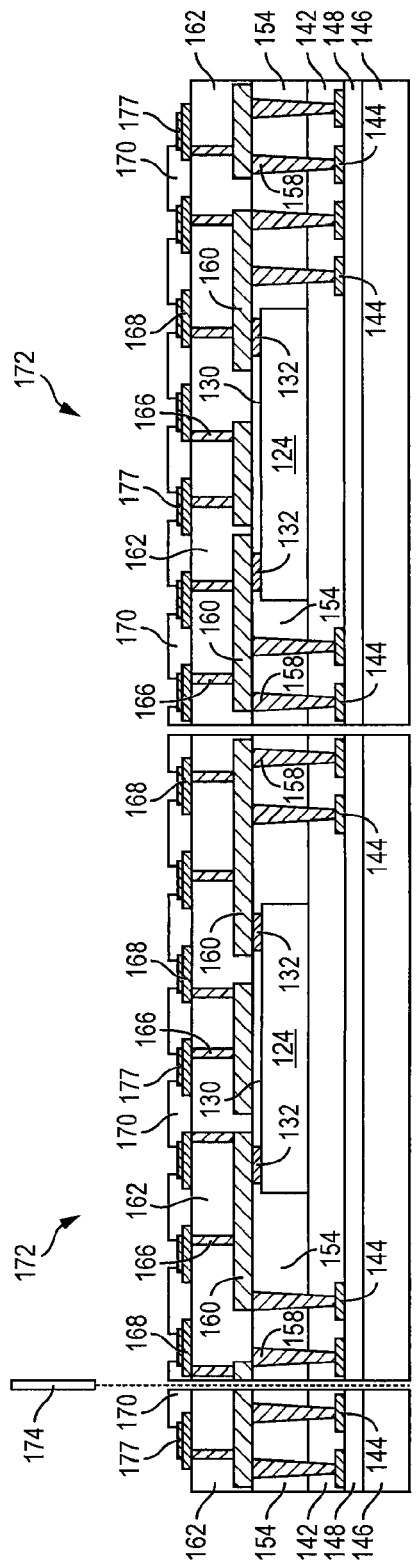

In FIG. 5m, semiconductor die 124 are singulated into individual Fo-WLCSP 172 using saw blade or laser cutting tool 174. FIG. 6a shows a cross-sectional view of Fo-WLCSP 172 after singulation. The temporary carrier 146 and interface layer 148 are removed by chemical etching, mechanical peel-off, CMP, mechanical grinding, thermal bake, UV light, laser scanning, or wet stripping to expose contact pads 144.

An electrically conductive bump material is deposited over UBM 177 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 177 using a suitable attachment or bonding process. In one embodiment, the bump material is reflowed by heating the material above its melting point to form spherical balls or bumps 176. In some applications, bumps 176 are reflowed a second time to improve electrical contact to UBM 177. The bumps can also be compression bonded to UBM 177. Bumps 176 represent one type of interconnect structure that can be formed over UBM 177.

In Fo-WLCSP 172, semiconductor die 124 is electrically connected through conductive layers 160 and 168 and conductive vias 158 and 166 to bumps 176 and contact pads 144 for external electrical interconnect. The array of contact pads 144 and bumps 176 are formed around a perimeter of semiconductor die 124. FIG. 6b shows a top view of Fo-WLCSP 172 with the array of contact pads 144. Fo-WLCSP 172 is formed without encapsulant or molding compound, as described in FIG. 1. Instead, polymer layers 142, 154, and 162 are formed around semiconductor die 124, conductive layers 160 and 168, conductive vias 158 and 166, and contact pads 144 to provide electrical isolation and structural support. Polymer layers 142, 154, and 162 can be formed with less height than the encapsulant found in the prior art. Accordingly, polymer layers 142, 154, and 162 provide flexible bump arrangement options, reduced bump pitch, increased I/O count, as well as reducing the height of Fo-WLCSP 172.

Figure 7:
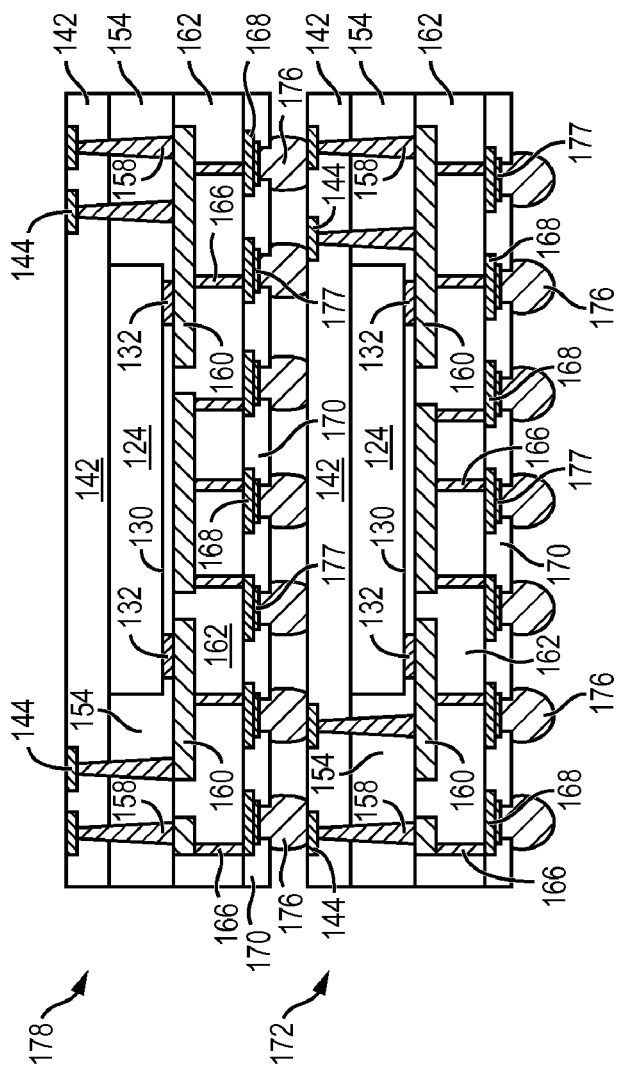
FIG. 7 illustrates a PoP arrangement of stacked Fo-WLCSP with conductive layers and conductive vias separated by polymer layers.

Fo-WLCSP 172 is suitable for package-on-package (PoP) applications, such as shown in FIG. 7, with Fo-WLCSP 178 stacked over Fo-WLCSP 172. Fo-WLCSP 178 is configured similar to Fo-WLCSP 172. The electrical signals between Fo-WLCSP 172 and Fo-WLCSP 178 are routed through the array of bumps 176 formed around the perimeter of semiconductor die 124. Since no gold wire bonds are used for signal transmission between the Fo-WLCSPs, the interconnect inductance and capacitance is reduced and signal integrity is improved. Reflection noise and crosstalk can be reduced by matching the impedance between semiconductor die 124 and conductive layers 160 and 168, conductive vias 158 and 166, and contact pads 144 formed in polymer layers 142, 154, and 162.

Figure 8I:
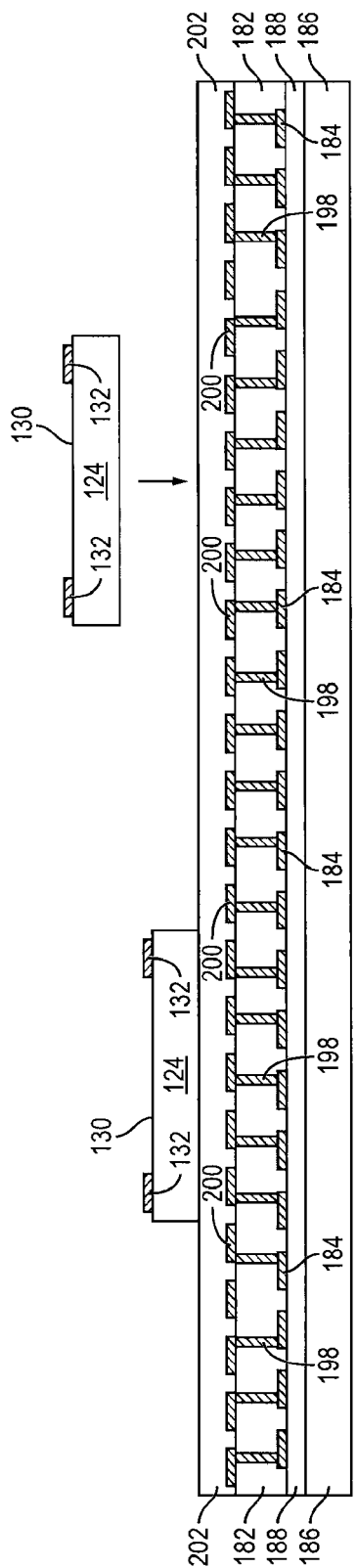
FIGS. 8a-8r illustrate another process of forming a Fo-WLCSP with conductive layers and conductive vias separated by polymer layers.
Figure 8J:
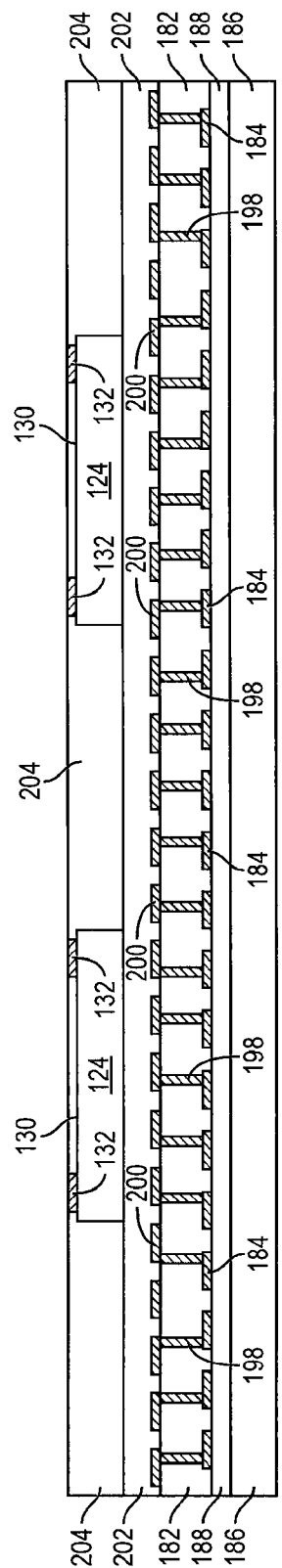
Figure 8K:
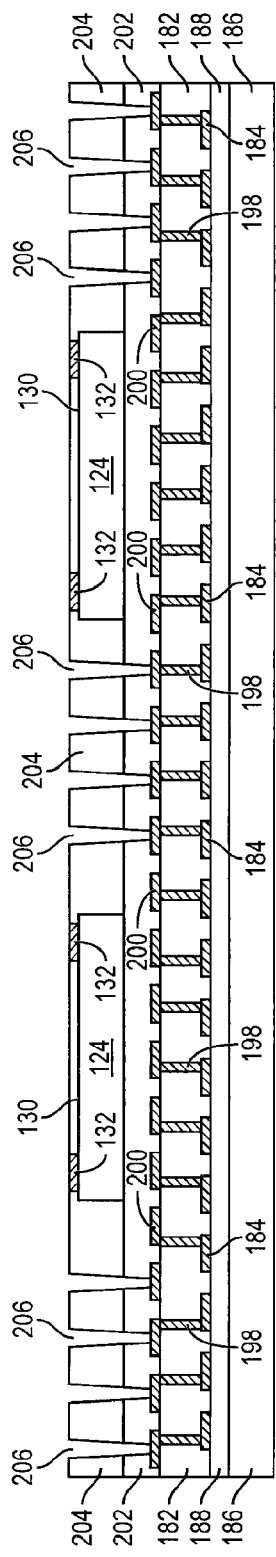
Figure 8L:
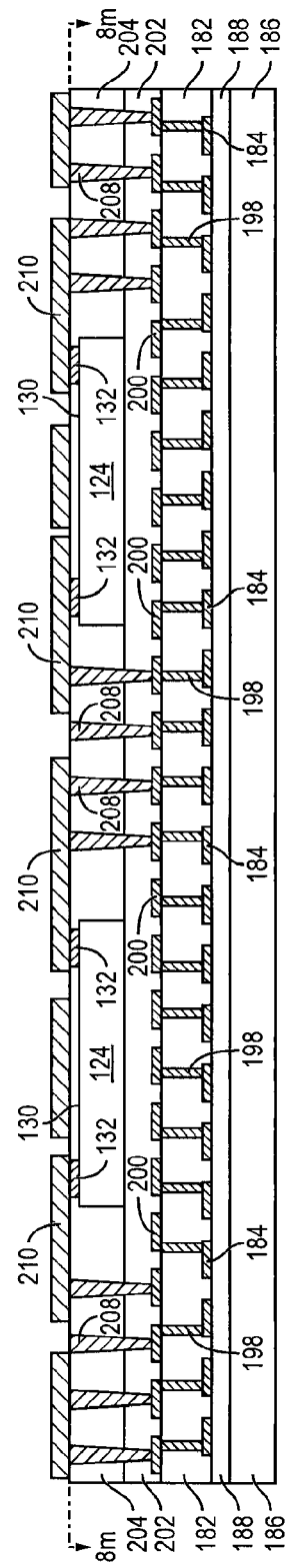
Figure 8M:
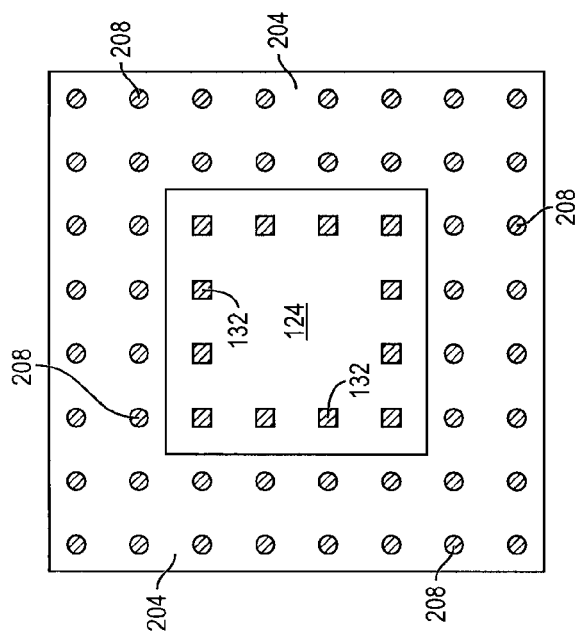
Figure 8N:
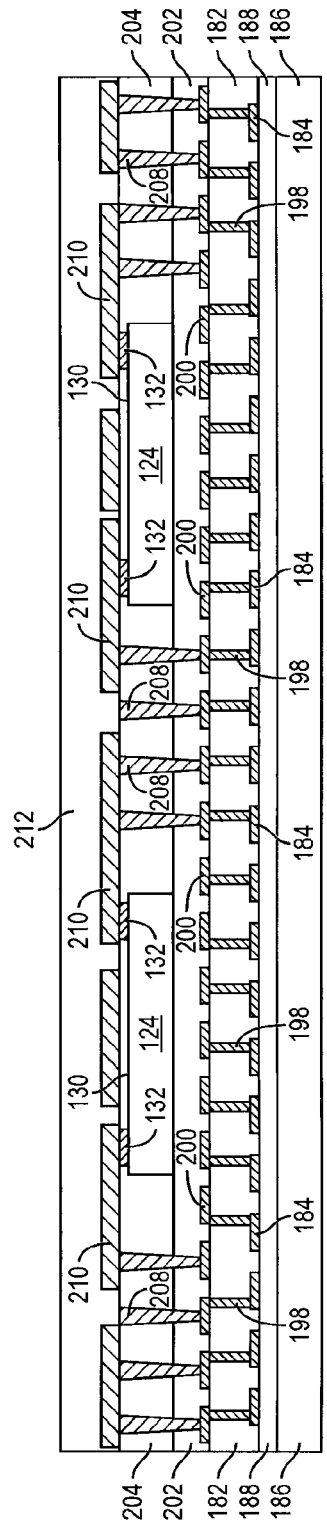
Figure 8O:
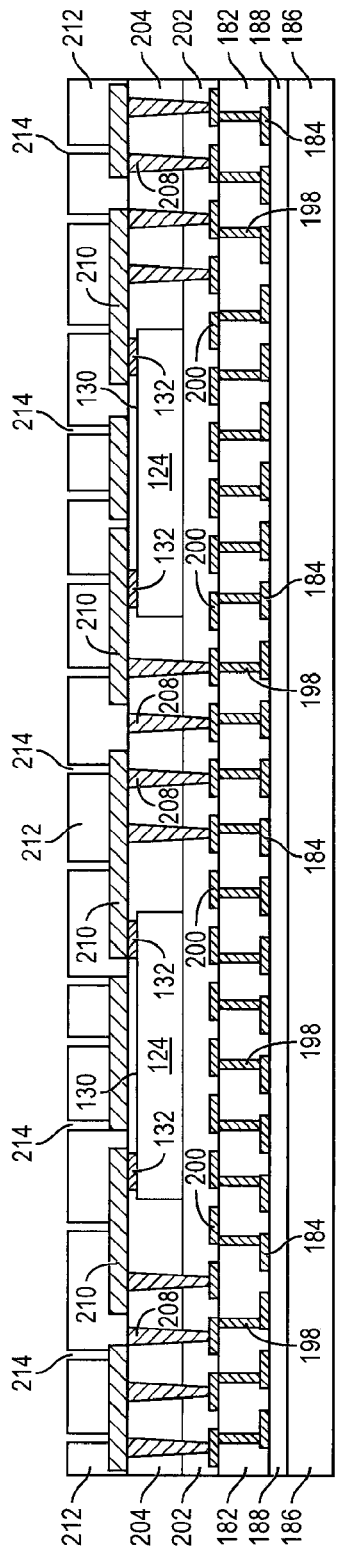
Figure 8P:
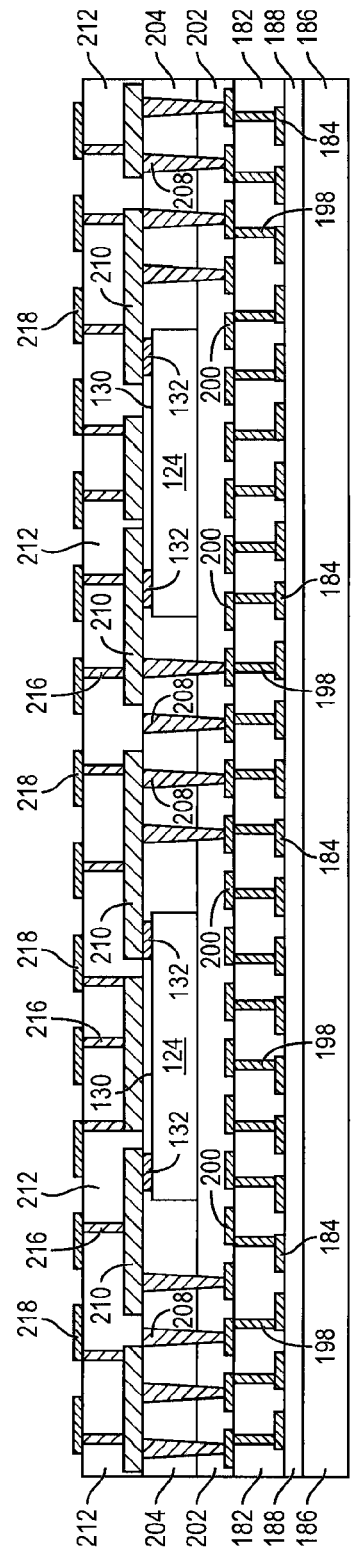
Figure 8Q:
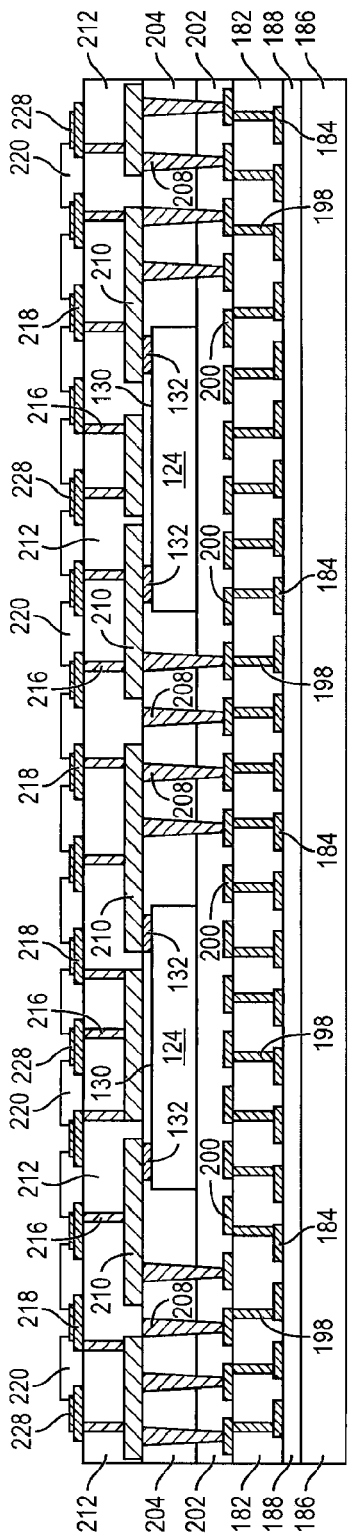
Figure 8R:
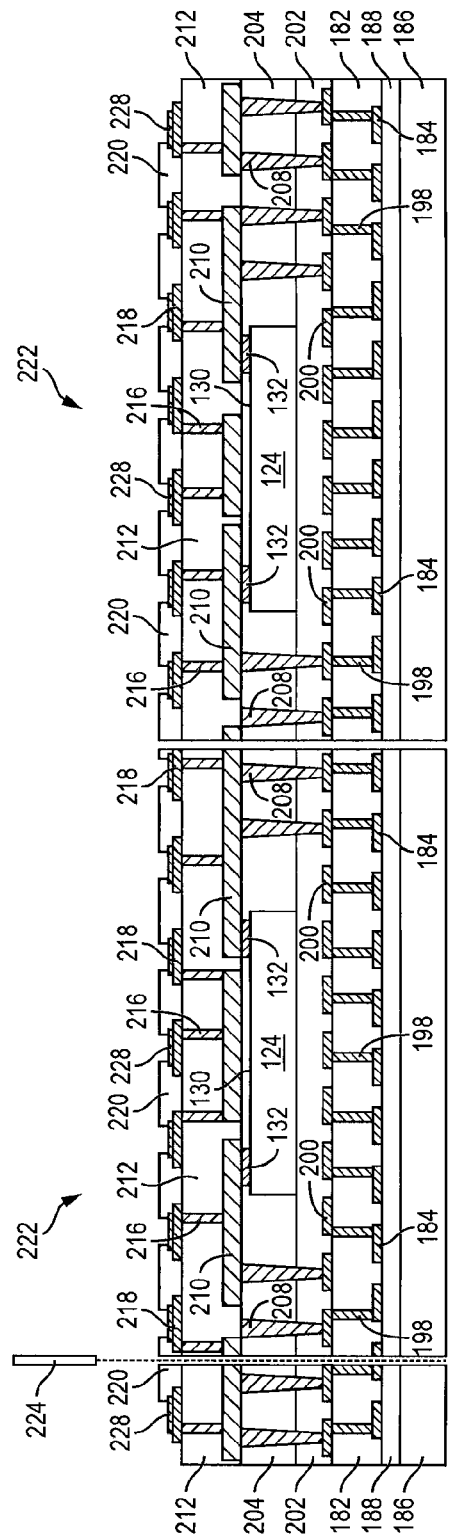

FIGS. 8a-8r illustrate, in relation to FIGS. 2 and 3a-3c, another process of forming a Fo-WLCSP with conductive layers and conductive vias separated by polymer layers. In FIG. 8a, a substrate or carrier 180 contains temporary or sacrificial base material such as silicon, polymer, beryllium oxide, or other suitable low-cost, rigid material for structural support. In one embodiment, carrier 180 is a tape.

A polymer layer 182 is formed over carrier 180. Polymer layer 182 can be an oxide, nitride, or glass material. An electrically conductive layer 184 is formed within polymer layer 182 using a patterning and metal deposition process such as PVD, CVD, sputtering, electrolytic plating, and electroless plating. Conductive layer 184 can be one or more layers of Al, Cu, Sn, Ni, Au, Ag, or other suitable electrically conductive material.

A temporary carrier or substrate 186 contains sacrificial base material such as silicon, polymer, polymer composite, metal, ceramic, glass, glass epoxy, beryllium oxide, or other suitable low-cost, rigid material for structural support. An interface layer or double-sided tape 188 is formed over carrier 186 as a temporary adhesive bonding film or etch-stop layer.

In FIG. 8b, leading with polymer layer 182 and contact pads 184, carrier 180 is mounted to interface layer 188 over carrier 186. In one embodiment, polymer layer 182 is laminated to interface layer 188. Conductive layer 184 operates as an array of contact pads uniformly disposed over substantially an entire surface area of polymer layer 182.

In FIG. 8c, carrier 180 is removed from polymer layer 182 by mechanical peeling in the direction of arrow 190. Polymer layer 182 and contact pads 184 remain affixed to interface layer 188 and carrier 186. Alternatively, carrier 180 can be removed by chemical etching, CMP, mechanical grinding, thermal bake, UV light, laser scanning, or wet stripping to expose polymer layer 182.

FIG. 8d shows polymer layer 182 after removal of carrier 182. A plurality of vias 196 is formed through polymer layer 182 extending down to contact pads 184 using mechanical drilling, laser drilling, or DRIE, as shown in FIG. 8e. In FIG. 8f, vias 196 are filled with Al, Cu, Sn, Ni, Au, Ag, Ti, W, poly-silicon, or other suitable electrically conductive material using electrolytic plating, electroless plating process, or other suitable metal deposition process to form z-direction conductive pillars or vias 198. Conductive vias 198 are electrically connected to contact pads 184. FIG. 8g shows a top view of conductive vias 198 formed over contact pads 184 taken along line 8g-8g of FIG. 8f.

An electrically conductive layer or RDL 200 is formed over polymer layer 182 and conductive vias 198 using a patterning and metal deposition process such as printing, PVD, CVD, sputtering, electrolytic plating, and electroless plating. Conductive layer 200 can be one or more layers of Al, Cu, Sn, Ni, Au, Ag, or other suitable electrically conductive material. One portion of conductive layer 200 is electrically connected to conductive vias 198. Other portions of conductive layer 200 can be electrically common or electrically isolated depending on the design and function of semiconductor die 124.

In FIG. 8h, a polymer layer 202 is formed over polymer layer 182 and conductive layer 200. Polymer layer 202 can be an oxide, nitride, or glass material. Polymer layers 182 and 202, conductive vias 198, and conductive layer 200 constitute an interconnect structure.

In FIG. 8i, semiconductor die 124 from FIG. 4a-4c are mounted to polymer layer 202 with active surface 130 oriented away from the polymer layer using a pick and place operation.

In FIG. 8j, a polymer layer 204 is formed over semiconductor die 124 and polymer layer 202. Polymer layer 204 can be an oxide, nitride, or glass material. A portion of polymer layer 204 can be removed by an etching process to expose contact pads 132 of semiconductor die 124 for subsequent electrical interconnect.

In FIG. 8k, a plurality of vias 206 is formed through polymer layer 204 and 202 extending down to conductive layer 200 using mechanical drilling, laser drilling, or DRIE. The vias 206 are formed around a perimeter of semiconductor die 124. In FIG. 8l, vias 206 are filled with Al, Cu, Sn, Ni, Au, Ag, Ti, W, poly-silicon, or other suitable electrically conductive material using electrolytic plating, electroless plating process, or other suitable metal deposition process to form z-direction conductive pillars or vias 208. Conductive vias 208 are electrically connected to conductive layer 200.

FIG. 8m shows a top view of conductive vias 208 formed around semiconductor die 124 taken along line 8m-8m in FIG. 8l.

An electrically conductive layer or redistribution layer RDL 210 is formed over polymer layer 204 and conductive vias 208 using a patterning and metal deposition process such as printing, PVD, CVD, sputtering, electrolytic plating, and electroless plating. Conductive layer 210 can be one or more layers of Al, Cu, Sn, Ni, Au, Ag, or other suitable electrically conductive material. One portion of conductive layer 210 is electrically connected to contact pads 132 and conductive vias 208. Other portions of conductive layer 210 can be electrically common or electrically isolated depending on the design and function of semiconductor die 124.

In FIG. 8n, a polymer layer 212 is formed over polymer layer 204 and conductive layer 210. Polymer layer 212 can be an oxide, nitride, or glass material. A plurality of vias 214 is formed through polymer layer 212 extending down to conductive layer 210 using mechanical drilling, laser drilling, or DRIE, as shown in FIG. 8o.

In FIG. 8p, vias 214 are filled with Al, Cu, Sn, Ni, Au, Ag, Ti, W, poly-silicon, or other suitable electrically conductive material using electrolytic plating, electroless plating process, or other suitable metal deposition process to form z-direction conductive pillars or vias 216. Conductive vias 216 are electrically connected to conductive layer 210.

An electrically conductive layer or RDL 218 is formed over polymer layer 212 and conductive vias 216 using a patterning and metal deposition process such as printing, PVD, CVD, sputtering, electrolytic plating, and electroless plating. Conductive layer 218 can be one or more layers of Al, Cu, Sn, Ni, Au, Ag, or other suitable electrically conductive material. One portion of conductive layer 218 is electrically connected to conductive vias 216. Other portions of conductive layer 218 can be electrically common or electrically isolated depending on the design and function of semiconductor die 124.

In FIG. 8q, an optional UBM 228 is formed over conductive layer 218. A solder resist layer 220 is formed over polymer layer 212, conductive layer 218, and UBM 228. A portion of solder resist layer 220 is removed by an etching process to expose conductive layer 218 or UBM 228 for bump formation or additional package interconnect. Alternatively, an insulating or passivation layer is formed over polymer layer 212, conductive layer 218, and UBM 228 using PVD, CVD, printing, spin coating, spray coating, sintering or thermal oxidation. The insulating layer contains one or more layers of SiO2, Si3N4, SiON, Ta2O5, Al2O3, or other material having similar insulating and structural properties. Polymer layer 212, conductive vias 216, conductive layer 218, UBM 228, and photoresist layer 220 constitute an interconnect structure.

Figure 9:
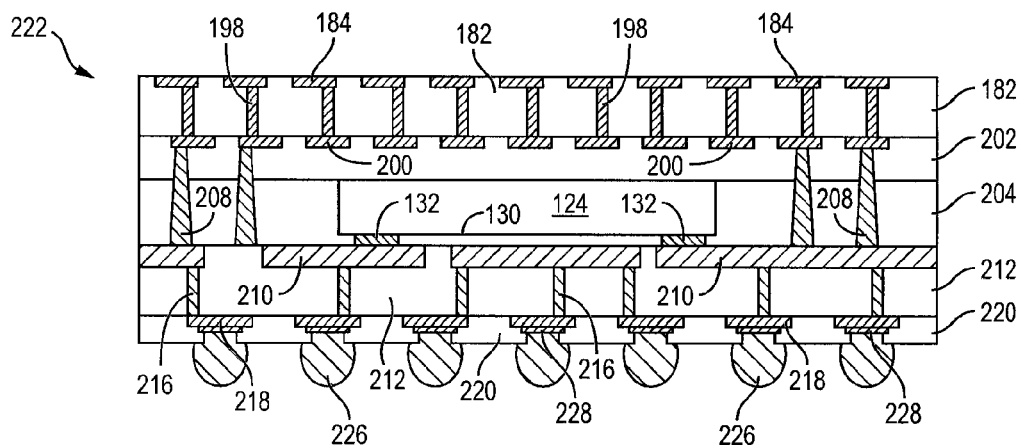
FIG. 9 illustrates the Fo-WLCSP with conductive layers and conductive vias separated by polymer layers.

In FIG. 8r, semiconductor die 124 are singulated into individual Fo-WLCSP 222 using saw blade or laser cutting tool 224. FIG. 9 shows a cross-sectional view of Fo-WLCSP 222 after singulation. The temporary carrier 186 and interface layer 188 are removed by chemical etching, mechanical peel-off, CMP, mechanical grinding, thermal bake, UV light, laser scanning, or wet stripping to expose contact pads 184.

An electrically conductive bump material is deposited over UBM 228 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 228 using a suitable attachment or bonding process. In one embodiment, the bump material is reflowed by heating the material above its melting point to form spherical balls or bumps 226. In some applications, bumps 226 are reflowed a second time to improve electrical contact to UBM 228. The bumps can also be compression bonded to UBM 228. Bumps 226 represent one type of interconnect structure that can be formed over UBM 228.

In Fo-WLCSP 222, semiconductor die 124 is electrically connected through conductive layers 200, 210, and 218 and conductive vias 198, 208, and 216 to bumps 226 and contact pads 184 for external electrical interconnect. The array of contact pads 184 and bumps 226 are formed over the full surface area of Fo-WLCSP 222. Fo-WLCSP 222 is formed without encapsulant or molding compound, as described in FIG. 1. Instead, polymer layers 182, 202, 204, and 212 are formed around semiconductor die 124, conductive layers 200, 210, and 218, conductive vias 198, 208, and 216, and contact pads 184 to provide electrical isolation and structural support. Polymer layers 182, 202, 204, and 212 can be formed with less height than the encapsulant found in the prior art. Accordingly, polymer layers 182, 202, 204, and 212 provide flexible bump arrangement options, reduced bump pitch, increased I/O count, as well as reducing the height of Fo-WLCSP 222.

Figure 10A:
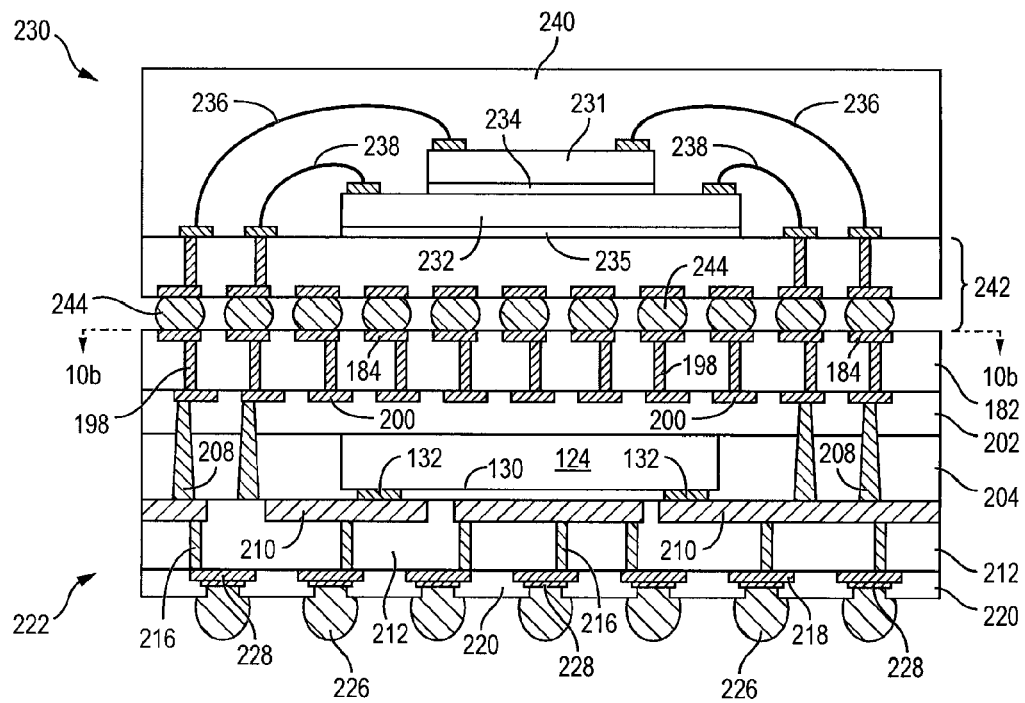
FIGS. 10a-10b illustrate a PoP Fo-WLCSP formed in accordance with FIG. 9.
Figure 10B:
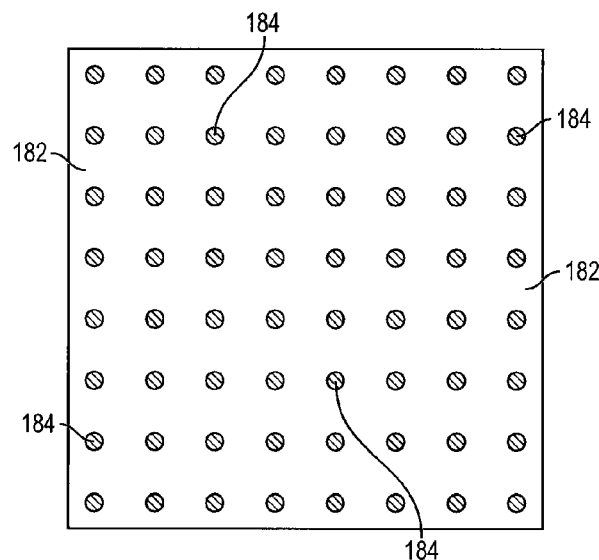

Fo-WLCSP 222 is suitable for PoP applications as shown in FIG. 10a with Fo-WLCSP 230 stacked over Fo-WLCSP 222. In Fo-WLCSP 230, semiconductor die 231 is mounted to semiconductor die 232 with die attach adhesive 234. Semiconductor die 231 and 232 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 231 and 232 may also contain IPDs, such as inductors, capacitors, and resistors, for RF signal processing. Bond wires 236 and 238 are electrically connected to contact pads on semiconductor die 231 and 232, respectively. An encapsulant 240 is deposited over semiconductor die 231 and 232 and bond wires 236 and 238. A build-up interconnect structure 242 is formed over semiconductor die 232 and encapsulant 240. Semiconductor die 232 is bonded to interconnect structure 242 with die attach adhesive 235. Bond wires 236 and 238 are electrically connected through interconnect structure 242 to bumps 244, which in turn are electrically connected to contact pads 184 of Fo-WLCSP 222. Semiconductor die 231 and 232, encapsulant 240, and interconnect structure 242 constitute a semiconductor package. FIG. 10b shows a cross-sectional view of contact pads 184 and polymer layer 182 taken through line 10b-10b in FIG. 10a.

The electrical signals between Fo-WLCSP 222 and Fo-WLCSP 230 are routed through the array of contact pads 184 and bumps 244. Since no gold wire bonds are used for signal transmission between the Fo-WLCSPs, the interconnect inductance and capacitance is reduced and signal integrity is improved. Reflection noise and crosstalk can be reduced by matching the impedance between semiconductor die 124 and conductive layers 200, 210, and 218, conductive vias 198, 208, and 216, and contact pads 184 formed in polymer layers 182, 202, 204, and 212.

Figure 11A:
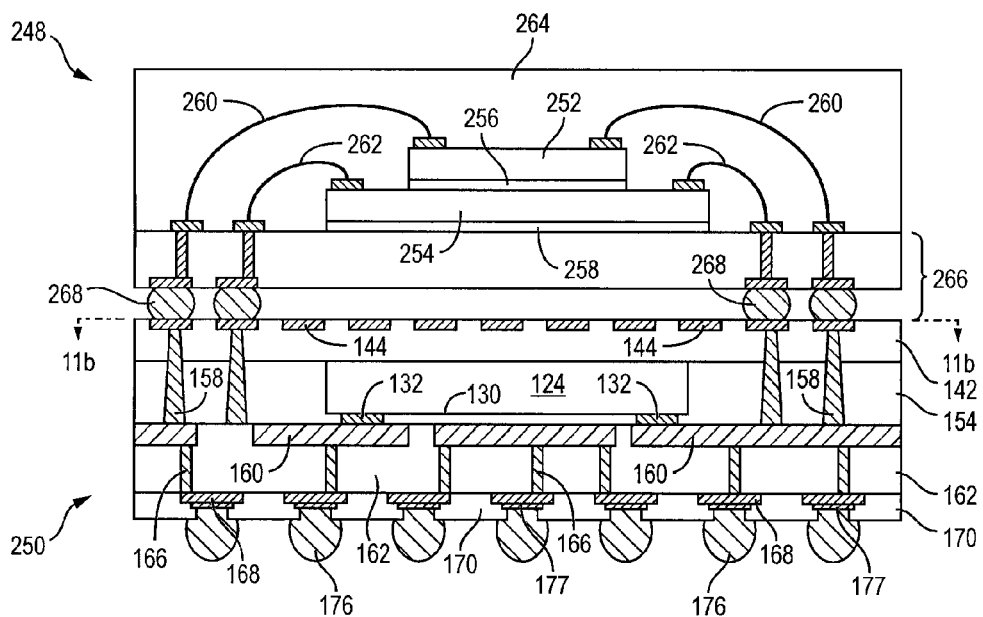
FIGS. 11a-11b illustrate a PoP Fo-WLCSP formed in accordance with FIGS. 6a-6b.
Figure 11B:
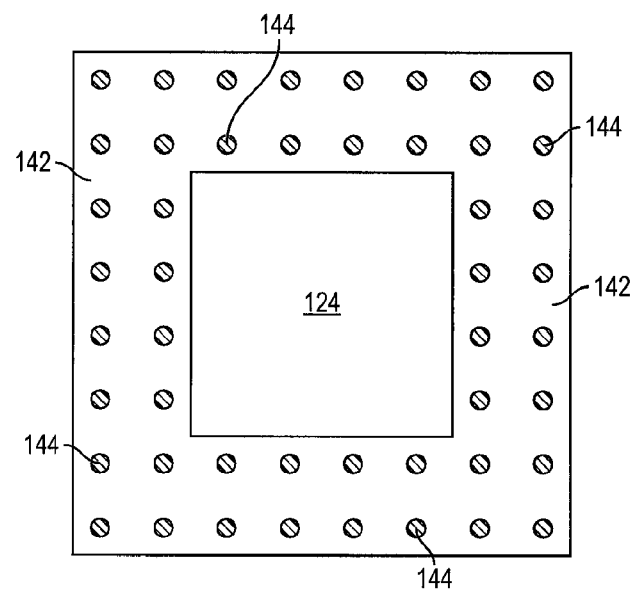

FIG. 11a shows another PoP configuration with Fo-WLCSP 248 stacked over Fo-WLCSP 250, similar to FIG. 6a. In Fo-WLCSP 248, semiconductor die 252 is mounted to semiconductor die 254 with die attach adhesive 256. Semiconductor die 252 and 254 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 252 and 254 may also contain IPDs, such as inductors, capacitors, and resistors, for RF signal processing. Bond wires 260 and 262 are electrically connected to contact pads on semiconductor die 252 and 254, respectively. An encapsulant 264 is deposited over semiconductor die 252 and 254 and bond wires 260 and 262. A build-up interconnect structure 266 is formed over semiconductor die 252 and 254 and encapsulant 264. Semiconductor die 254 is bonded to interconnect structure 266 with die attach adhesive 258. Bond wires 260 and 262 are electrically connected through interconnect structure 266 to bumps 268, which in turn are electrically connected to contact pads 144 of Fo-WLCSP 250. Semiconductor die 252 and 254, encapsulant 264, and interconnect structure 266 constitute a semiconductor package. FIG. 11b shows a cross-sectional view of contact pads 144 and polymer layer 142 taken through line 11b-11b in FIG. 11a.

The electrical signals between Fo-WLCSP 248 and Fo-WLCSP 250 are routed through the array of contact pads 144 and bumps 268. Since no gold wire bonds are used for signal transmission between the Fo-WLCSPs, the interconnect inductance and capacitance is reduced and signal integrity is improved. Reflection noise and crosstalk can be reduced by matching the impedance between semiconductor die 124 and conductive layers 160 and 168, conductive vias 158 and 166, and contact pads 144 formed in polymer layers 142, 154, and 162.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a wafer level chip scale package (WLCSP), comprising:
    providing a first polymer layer including a plurality of contact pads formed within the first polymer layer;
    mounting the first polymer layer to a carrier;
    mounting a semiconductor die to the first polymer layer;
    forming a second polymer layer over the semiconductor die and first polymer layer;
    forming a plurality of first conductive vias through the first and second polymer layers with the first conductive vias electrically connected to the contact pads within the first polymer layer;
    forming a first conductive layer over the second polymer layer and electrically connected to the first conductive vias and semiconductor die;
    forming a third polymer layer over the second polymer layer and first conductive layer;
    forming a plurality of second conductive vias through the third polymer layer and electrically connected to the first conductive layer;
    forming a second conductive layer over the third polymer layer and electrically connected to the second conductive vias; and
    forming a first interconnect structure over the third polymer layer and second conductive layer.

2. The method of claim 1, further including forming the first conductive vias around a perimeter of the semiconductor die.

3. The method of claim 1, further including forming the contact pads around a perimeter of the semiconductor die.

4. The method of claim 1, further including forming the contact pads under the semiconductor die.

5. The method of claim 1, wherein forming the first interconnect structure includes:
    forming an insulating layer over the third polymer layer and second conductive layer;
    removing a portion of the insulating layer to expose the second conductive layer; and
    forming a plurality of bumps over the exposed second conductive layer.

6. The method of claim 1, further including:
    providing a semiconductor package;
    mounting the semiconductor package to the WLCSP; and
    electrically connecting the semiconductor package to the WLCSP through the first interconnect structure.

7. The method of claim 1, further including:
    removing the carrier; and
    forming a second interconnect structure over the first polymer layer and contact pads.

8. A method of making a wafer level chip scale package (WLCSP), comprising:
    providing a first polymer layer including a plurality of contact pads formed within the first polymer layer;
    mounting the first polymer layer over a carrier;
    forming a plurality of first conductive vias through the first polymer layer and electrically connected to the contact pads;

forming a first conductive layer over the first polymer layer and electrically connected to the first conductive vias;

forming a second polymer layer over the first polymer layer;

mounting a semiconductor die to the second polymer layer;

forming a third polymer layer over the semiconductor die and second polymer layer;

forming a plurality of second conductive vias through the second and third polymer layers and electrically connected to the first conductive layer;

forming a second conductive layer over the third polymer layer and electrically connected to the second conductive vias and semiconductor die;

forming a fourth polymer layer over the third polymer layer and second conductive layer;

forming a plurality of third conductive vias through the fourth polymer layer and electrically connected to the second conductive layer;

forming a third conductive layer over the fourth polymer layer and electrically connected to the third conductive vias; and forming a first interconnect structure over the fourth polymer layer and third conductive layer.

9. The method of claim 8, further including:
forming the first conductive vias under the semiconductor die; and
forming the contact pads under the semiconductor die.

10. The method of claim 8, further including forming the second conductive vias around a perimeter of the semiconductor die.

11. The method of claim 8, wherein forming the first interconnect structure includes:
forming an insulating layer over the fourth polymer layer and third conductive layer;
removing a portion of the insulating layer to expose the third conductive layer; and
forming a plurality of bumps over the exposed third conductive layer.

12. The method of claim 8, further including:
providing a semiconductor package;
mounting the semiconductor package to the WLCSP; and
electrically connecting the semiconductor package to the WLCSP through the first interconnect structure.

13. The method of claim 8, further including:
removing the carrier; and
forming a second interconnect structure over the first polymer layer and contact pads.

14. A method of making a wafer level chip scale package (WLCSP), comprising:
providing a first polymer layer including a plurality of contact pads formed within the first polymer layer;
mounting a semiconductor die over the first polymer layer;
forming a second polymer layer around the semiconductor die;
forming a plurality of first conductive vias through the first and second polymer layers and electrically connected to the contact pads;
forming a first interconnect structure over a first surface of the second polymer layer and electrically connected to the first conductive vias; and
forming a second interconnect structure over a second surface of the second polymer layer opposite the first surface and electrically connected to the first conductive vias.

15. The method of claim 14, wherein forming the first interconnect structure includes:

forming a plurality of second conductive vias through the first polymer layer and electrically connected to the contact pads;

forming a conductive layer over the first polymer layer and electrically connected to the second conductive vias; and forming a third polymer layer over the first polymer layer.

16. The method of claim 15, further including:
forming the second conductive vias under the semiconductor die; and
forming the contact pads under the semiconductor die.

17. The method of claim 14, wherein forming the second interconnect structure includes:
forming a first conductive layer over the second polymer layer electrically connected to the first conductive vias and semiconductor die;
forming a third polymer layer over the first polymer layer and first conductive layer;
forming a plurality of second conductive vias through the third polymer layer and electrically connected to the first conductive layer; and
forming a second conductive layer over the third polymer layer and electrically connected to the second conductive vias.

18. The method of claim 14, further including forming the first conductive vias around a perimeter of the semiconductor die.

19. The method of claim 14, further including:
providing a semiconductor package;
mounting the semiconductor package to the WLCSP; and
electrically connecting the semiconductor package to the WLCSP through the first interconnect structure or second interconnect structure.

20. A wafer level chip scale package (WLCSP), comprising:
a first interconnect structure;
a plurality of contact pads exposed on a first surface of the first interconnect structure;
a semiconductor die mounted over a second surface of the interconnect structure opposite the first surface;
a first polymer layer formed around the semiconductor die;
a plurality of first conductive vias formed through the first polymer layer and electrically connected to the contact pads; and
a second interconnect structure formed over a surface of the first polymer layer opposite the first interconnect structure and electrically connected between the first conductive vias and the semiconductor die.

21. The WLCSP of claim 20, wherein the first interconnect structure includes:
a second polymer layer with the contact pads formed within the second polymer layer;
a plurality of second conductive vias formed through the second polymer layer and electrically connected to the contact pads;
a conductive layer formed over the second polymer layer and electrically connected to the second conductive vias; and
a third polymer layer formed over the second polymer layer.

22. The WLCSP of claim 20, wherein the second interconnect structure includes:
a first conductive layer formed over the first polymer layer and electrically connected to the first conductive vias and semiconductor die;
a second polymer layer formed over the first polymer layer and first conductive layer;

a plurality of second conductive vias formed through the second polymer layer and electrically connected to the first conductive layer; and a second conductive layer over the second polymer layer and electrically connected to the second conductive vias.

23. The WLCSP of claim 20, further including a semiconductor package mounted to the WLCSP and electrically connected to the WLCSP through the first interconnect structure or second interconnect structure.

24. A method of making a wafer level chip scale package (WLCSP), comprising:

providing a first polymer layer including a contact pad formed within a first surface of the first polymer layer;

mounting a semiconductor die over a second surface of the first polymer layer opposite the first surface;

forming a second polymer layer over the first polymer layer and semiconductor die; and forming a first conductive via through the first polymer layer and second polymer layer and electrically connected to the contact pad.

25. The WLCSP of claim 24, further including forming an interconnect structure over the second polymer layer electrically connected to the first conductive via and the semiconductor die.

26. The WLCSP of claim 25, wherein forming the interconnect structure further includes:

forming a conductive layer over the semiconductor die electrically connected to the first conductive via and the semiconductor die;

forming a third polymer layer over the conductive layer; and forming a second conductive via through the third polymer layer electrically connected to the conductive layer.

27. The WLCSP of claim 24, further including forming an interconnect structure over the first polymer layer electrically connected to the contact pad.

28. The WLCSP of claim 27, wherein forming the interconnect structure further includes:

forming a third polymer layer over the first surface of the first polymer layer; and forming a second conductive via through the third polymer layer electrically connected to the contact pad.

29. The WLCSP of claim 24, further including forming a third polymer layer over the second surface of the first polymer layer prior to mounting the semiconductor die.

30. The WLCSP of claim 24, further including mounting a semiconductor package over the WLCSP.

* * * * *